(12) United States Patent
La Fontaine et al.

(10) Patent No.: US 6,556,286 B1
(45) Date of Patent: Apr. 29, 2003

(54) INSPECTION SYSTEM FOR THE PUPIL OF A LITHOGRAPHIC TOOL

(75) Inventors: Bruno M. La Fontaine, Pleasanton, CA (US); Harry J. Levinson, Saratoga, CA (US); Jongwook Kye, Pleasanton, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/845,789

(22) Filed: Apr. 30, 2001

(51) Int. Cl.[7] .................................................. G01B 9/00
(52) U.S. Cl. .................... 356/124; 356/121; 356/239.2; 356/237.1; 355/55; 355/70
(58) Field of Search ................................. 356/124, 121, 356/239.2, 237.1; 355/55, 70

(56) References Cited

U.S. PATENT DOCUMENTS

| | | | | | |
|---|---|---|---|---|---|
| 3,783,520 | A | * | 1/1974 | King ........................... | 356/508 |
| 4,585,342 | A | * | 4/1986 | Lin et al. ..................... | 356/121 |
| 5,723,238 | A | * | 3/1998 | Moore et al. ................. | 216/59 |
| 5,808,731 | A | * | 9/1998 | Kirk ........................... | 356/124 |
| 5,969,807 | A | * | 10/1999 | Levinson et al. ............. | 355/55 |
| 5,973,771 | A | * | 10/1999 | Hibbs et al. ................ | 250/205 |

* cited by examiner

*Primary Examiner*—Frank G. Font
*Assistant Examiner*—Roy M. Punnoose
(74) *Attorney, Agent, or Firm*—Foley & Lardner

(57) ABSTRACT

An inspection tool or inspection system can be utilized to determine whether the appropriate pattern is on a reticle. The reticle can be associated with EUV lithographic tools. The system utilizes an at least two wavelengths of light. The light is directed to the reticle at the at least two wavelengths of light.

20 Claims, 5 Drawing Sheets

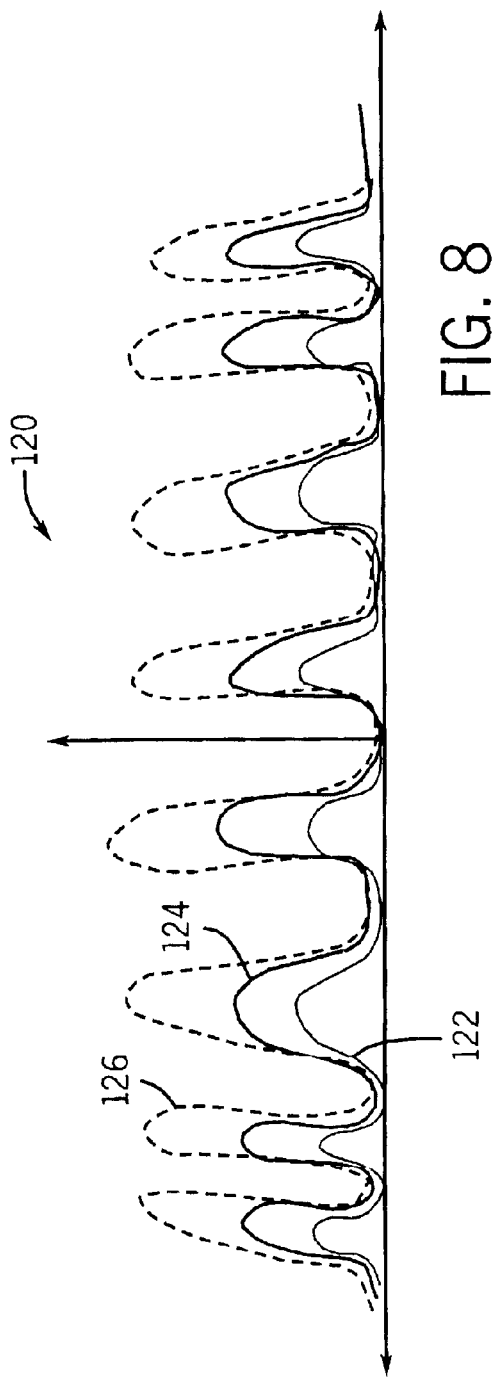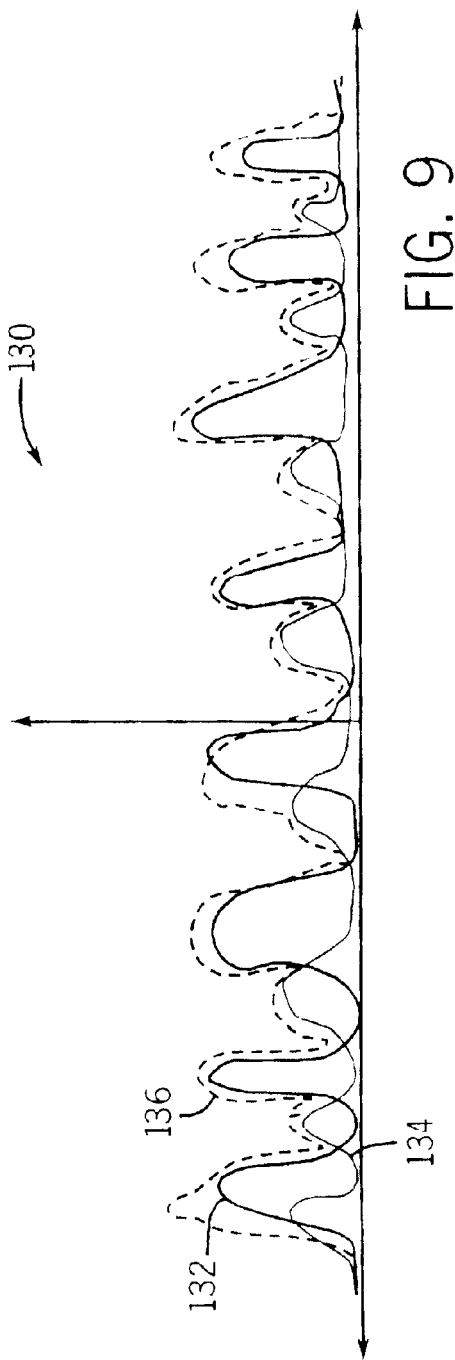

INSPECTION SYSTEM FOR THE PUPIL OF A LITHOGRAPHIC TOOL

FIELD OF THE INVENTION

The present invention relates generally to an inspection system and an inspection method. More particularly, the present invention relates to an inspection system for and a method of determining errors introduced by a photolithographic camera or stepper unit.

BACKGROUND OF THE INVENTION

The semiconductor or IC industry desires to manufacture integrated circuits (ICs) with higher and higher densities of devices on a smaller chip area to achieve greater functionality and to reduce manufacturing costs. This desire for large scale integration has led to a continued shrinking of circuit dimensions and device features.

The ability to reduce the size of structures, such as, gate lengths in field-effect transistors and the width of conductive lines, is driven by lithographic performance. In conventional commercial fabrication processes, lithographic systems, such as, photolithographic cameras or stepper units, expose a photoresist material to a pattern of radiation. The photoresist material is developed in accordance with the pattern of radiation to form a pattern of the photoresist material on a wafer. The wafer is processed in accordance with the pattern of photoresist material.

A conventional lithographic system or photolithographic machine can be a projection printing machine using refractive optics in a step-and-repeat projection method.

Conventional lithographic systems generally include a light source configured to provide radiation or light at one or more wavelengths. For example, the light source may include an excimer laser producing radiation at a wavelength of 248 nm, 193 nm, and/or 157 nm. The excimer laser can use a KrF source, a ArF source, a $F_2$ source, etc. The lithographic systems can further include a first lens assembly, a Chromium (Cr) mask, and a second lens assembly. The radiation is provided from the light source through the first lens assembly, through the mask, through the second lens assembly to a semiconductor wafer having a layer of photoresist material.

The first lens assembly can be a condenser lens, and the second assembly can be an objective lens. The radiation can be light, such as ultraviolet light, vacuum ultraviolet (VUV) light, and deep ultraviolet light. In alternative systems, the radiation can be x-ray radiation, e-beam radiation, extreme ultraviolet (EUV) light, etc.

As described above, conventional lithographic systems can utilize multiple optical elements to focus and direct light to the semiconductor wafer. Generally, the multiple optical elements can be considered as a single equivalent lens. The pupil of the lithographic system refers to the equivalent lens. The size of the pupil is the diameter of the equivalent lens and the location of the pupil is the location of the plane of the equivalent lens. The pupil is utilized to mathematically model image formation by the optical elements of the lithographic system.

Conventional lithographic systems include lens assemblies which are susceptible to lens aberrations or errors. These errors result in errors in the wavefront that is used by the lithographic stepper unit to produce the image on the wafer. As light passes through the objective lens assembly, an imperfection can locally increase or decrease the finite optical path. These imperfections can result in placement errors or critical dimension (CD) errors in the lithographic pattern. These errors are particularly problematic as sizes of lithographic features become smaller.

Accordingly, the pupil of the conventional lithographic system is often tested to determine at which locations errors are introduced into the pupil plane. Heretofore, the pupil of the conventional lithographic systems are probed or tested before installation (e.g., off-line) of the lithographic system by a laser interferometer. The use of a laser interferometer is not practicable after the lithographic system is installed. Other conventional techniques probe particular aberrations and require overlay measurement tools.

Thus, there is a need for a highly accurate inspection system that can be utilized to detect defects and patterns on a pupil. Further, there is a need for a semiconductor fabrication inspection tool for measuring and locating wavefront errors associated with a lithographic system. Even further still, there is a need for a process or method of detecting pupil errors or lens aberrations in situ (e.g., in-line). Even further still, there is a need for an inspection tool and inspection method that is capable of reliably detecting errors on the entire pupil.

SUMMARY OF THE INVENTION

An exemplary embodiment relates to a method of inspecting a lens assembly for a lithographic stepper. The method includes providing radiation at a first coherence through a mask or reticle to a photoresist material, and providing radiation at a second coherence through the mask or reticle to the photoresist material. The method can also include developing the photoresist material, and observing the photoresist material.

Another exemplary embodiment relates to a method of inspecting a pupil associated with manufacture of an integrated circuit. The method includes providing a pattern of low coherence radiation to a photoresist material, providing a pattern of high coherence radiation to the photoresist material, and developing the photoresist material. The method also includes observing the photoresist material.

Still another exemplary embodiment relates to an inspection system for an optical system. The optical system is for use in an integrated circuit fabrication system. The inspection system includes means for providing radiation at a first coherence to a photoresist material, means for providing radiation at a second coherence to the photoresist material. The inspection system also includes means for developing the photoresist material and means for observing the photoresist material.

BRIEF DESCRIPTION OF THE DRAWINGS

The present invention will hereafter be described with reference to the accompanying drawings, wherein like numerals denote like elements, and:

FIG. 8 is a graph showing the intensity of light transmitted through the mask illustrated in FIG. 4 for both coherence settings ($\sigma_1$ and $\sigma_2$), for a lens that is free of aberrations; and FIG. 9 is a graph showing the intensity of light transmitted through the mask illustrated in FIG. 4 for both coherence settings ($\sigma_1$ and $\sigma_2$), for a lens having some degree of aberrations.

DETAILED DESCRIPTION OF THE PREFERRED EMBODIMENTS

Figure 1:
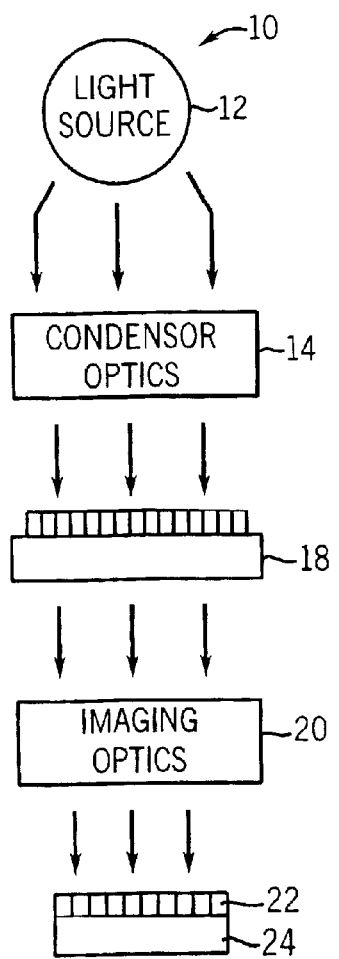
FIG. 1 is a general schematic block diagram of a lithographic system including condenser and imaging lens assemblies and a reticle or mask, the imaging lens assembly of the lithographic system can be inspected in accordance with an exemplary embodiment.

With reference to FIG. 1, a camera stepper unit or lithographic system 10 can be analyzed in situ, or in-line, according to an advantageous process. System 10 includes reticle or mask 18 optimized to test system 10 for lens aberration errors. Lithographic system 10 can be any tool for use in integrated circuit (IC) fabrication which includes at least one lens assembly.

Lithographic system 10 includes a light source 12, a lens assembly 14, and a lens assembly 20. Mask 18 is placed between lens assembly 14 and lens assembly 20. System 10 is configured to provide radiation from light source 12 through lens assembly 14, through mask 10, and lens assembly 20 to a photoresist layer 22.

Photoresist layer 22 can be provided on a substrate 24. Substrate 24 can be an integrated circuit (IC) wafer, a semiconductive material, an insulative material, a conductive material, layers above any of the listed materials, or a base layer. Substrate 24 can be an industry standard silicon wafer. Substrate 24 is not described in a limiting fashion.

Light source 12 can be any number of sources of electromagnetic radiation. System 10 is designed to utilize radiation at a wavelength ($\lambda$) of 10–1000 nm at a coherence level between 0 and 1 (pupil fill factor ($\sigma$) (PFF)). Light source 12 preferably provides light at a wavelength of 450 nm.

Light provided from light source 12 is provided through mask 18 in accordance with the pattern on mask 18 to lens assembly 20. Lens assembly 20 provides the patterned light to photoresist layer 22. Photoresist layer 22 is selected to have photochemical reactions in response to the light from source 12. Photoresist layer 22 can be any conventional positive or negative resist material.

Optics 14 preferably allows the coherence level to be adjusted from a pupil fill factor of $\sigma=0.25$ or less (high coherence) to a pupil fill factor of $\sigma=0.85$ or more (low coherence).

When a low coherence level ($\sigma_1$) of light is provided from light source 12 through mask 18 to photoresist layer 22, a low coherence image is provided on photoresist layer 22 that is not as sensitive to local errors in the pupil (wavefront errors) as a high coherence image would be. The low coherence image can thus be used as a reference image because it is not as sensitive to local pupil errors.

When the high coherence level ($\sigma_2$) of light is provided from light source 22 through mask 18 to photoresist layer 22, a high coherence image is provided on photoresist layer 22 that is more sensitive to local pupil errors. The low coherence image and the high coherence image are both recorded in the same photoresist layer 22.

The low coherence image and the high coherence image are superimposed upon each other. The presence of errors will distort the patterns provided in photoresist layer 22 and provide a moiré effect that can be observed with an optical microscope. If errors are not present in lens assembly 20, the low coherence image and the high coherence image are provided without significant distortion and the high coherence image matches the location of the reference image (e.g., the low coherence image). Thus, the pupil assembly 20 can be probed by utilizing high and low coherence levels ($\sigma_1$ and $\sigma_2$) light and imaging photoresist pattern accordingly.

Figure 2:
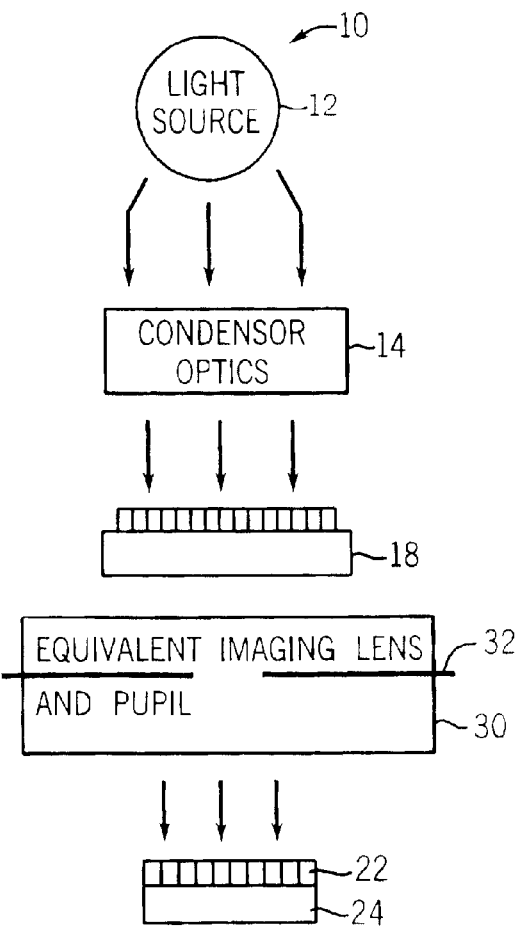
FIG. 2 is a general schematic block diagram of the lithographic system illustrated in FIG. 1, the block diagram of FIG. 2 includes a pupil representing the imaging lens assembly shown in FIG. 1.

With reference to FIG. 2, system 10 is shown including an equivalent lens 30 representative of lens assembly 20. The equivalent lens assembly 30 includes a pupil 32. Errors can be ascertained with respect to pupil 32 via the process discussed below with reference to FIG. 7. Errors can be localized and characterized on pupil 32 so that appropriate corrective action may be taken.

Figure 3:
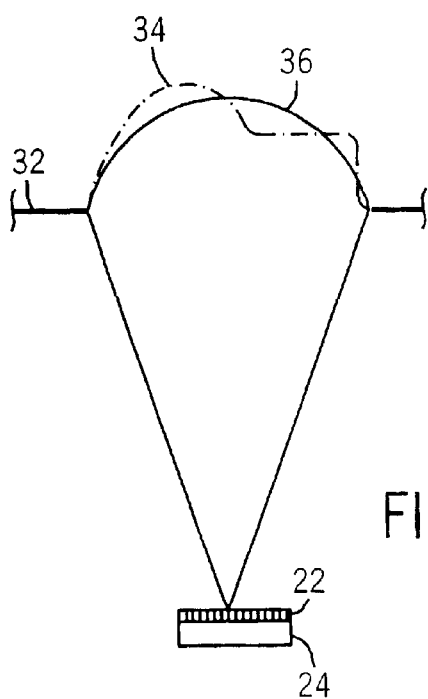
FIG. 3 is a general schematic representation of errors or aberrations associated with the lens assemblies of the lithographic system illustrated in FIG. 1 or the pupil illustrated in FIG. 2.

With reference to FIG. 3, aberration errors associated with pupil 32 are demonstrated. A dashed line 34 represents the wavefront through pupil 32. The errors (phase delays, etc.) on the wavefront associated with pupil 32 are manifested as the non-spherical portions of dashed line 34. The errors result in an increase or decrease of the optical path from the reticle to layer 22.

A solid line 36 represents an ideal wavefront provided in a pupil 32 without errors or aberrations. The shape of line 36 is spherical.

Figure 4:
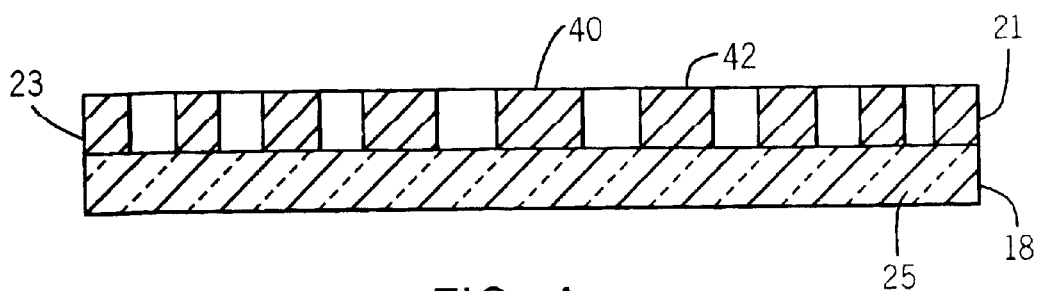
FIG. 4 is a more detailed schematic cross-sectional view about line 4—4 of FIG. 5 of the mask or reticle illustrated in FIGS. 1, 2 and 3, the mask or reticle includes a pattern in accordance with another exemplary embodiment.
Figure 5:
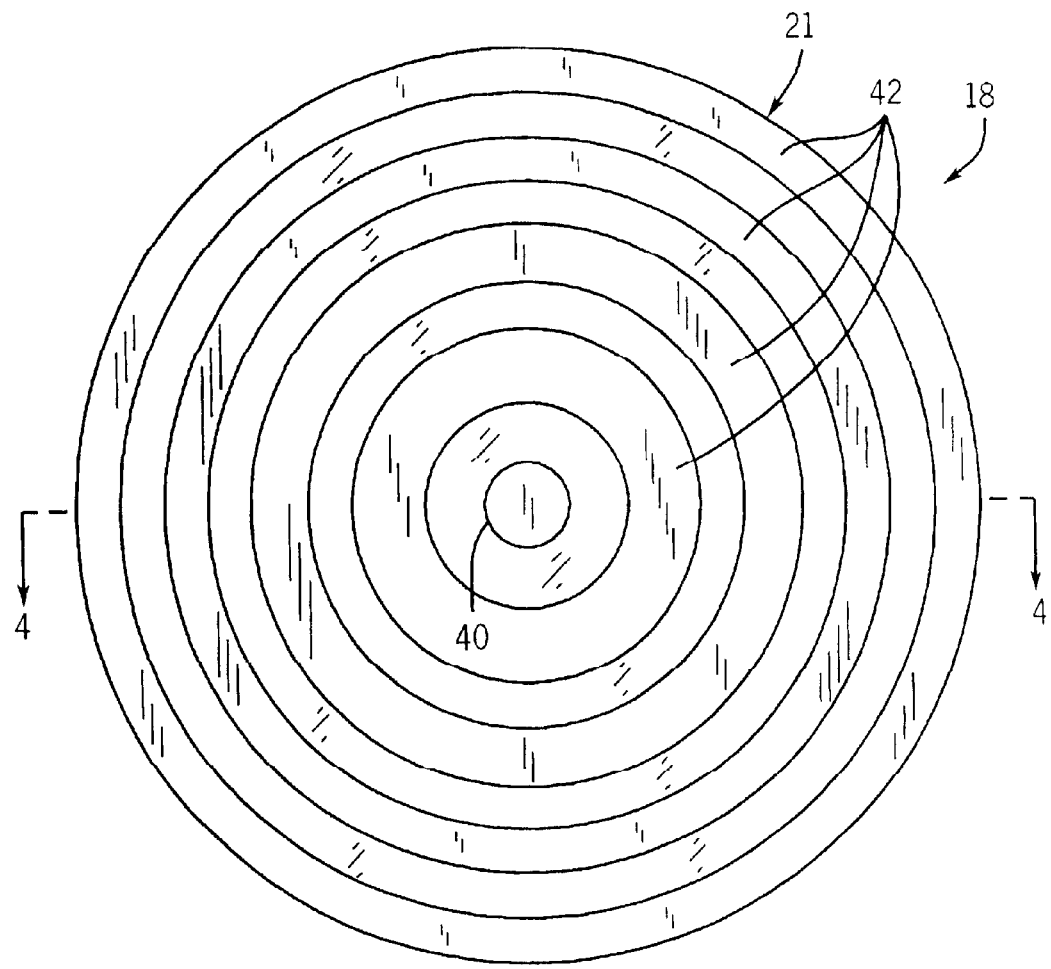
FIG. 5 is a top view of the mask or reticle illustrated in FIG. 4, the mask or reticle is utilized to inspect the lithographic system illustrated in FIG. 1.

With reference to FIGS. 4 and 5, an exemplary pattern for mask 18 is shown. Mask 18 includes an absorbing pattern 21 provided on a substrate 25. Mask 18 can include a fused silica substrate 25 and opaque material 23 provided in pattern 21. Mask 18 can also include anti-reflective coatings for reducing loss of light during lithography due to reflections. Mask 18 can also include phase shift regions for increasing resolution.

Substrate 25 can be a 6.35 millimeter, a 9 millimeter, or other standard thickness glass or fused silica material. Opaque material 23 is an absorbing material layer which can have a thickness of 200–1000 Angstroms (preferably 500 Angstroms or less). Optical material 23 can include chromium, chromium oxide, or other absorbing materials. The materials associated with mask 18 are not discussed in a limiting fashion.

Pattern 21 is shown in FIGS. 4 and 5 in exemplary fashion only. Pattern 21 is not drawn to scale. Preferably, pattern 21 can be embodied as a circular chirped grating. One type of circular chirped grating can be a fresnel zone plate pattern.

Pattern 21 can include a solid circle 40 surrounded by rings 42 having decreased widths as the perimeter of mask 18 is reached. Preferably, the final ring at the perimeter has a dimension on the order of the resolution of lens assemblies 14 and 20 (e.g., 50 nm to 150 nm).

The relationship between the sizes of rings 42 can vary. For example, a linear decrease in size can occur as rings 42 approach the perimeter of mask 18. Alternatively, inverse square or other relationships can be utilized. Preferably, circle 40 and rings 42 are concentric to each other. The pattern discussed with reference to FIGS. 4 and 5 is only one exemplary embodiment. Other patterns can replace pattern 21.

Figure 6A:
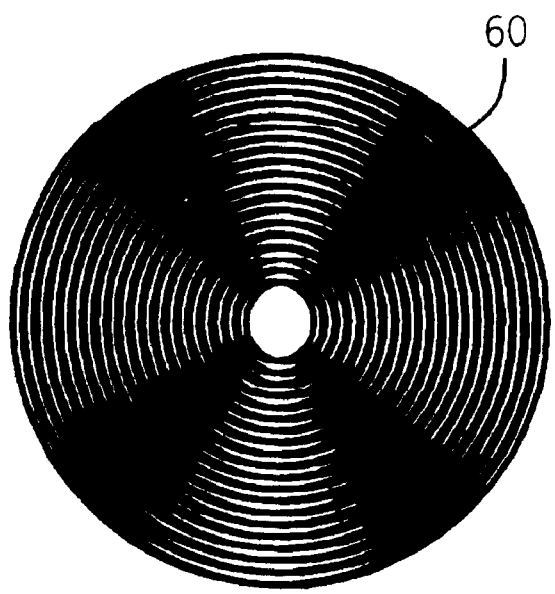
FIGS. 6A and 6B are schematic general drawings of an exemplary pattern on a photoresist layer formed by the process of FIG. 7 in accordance with still another exemplary embodiment.
Figure 6B:
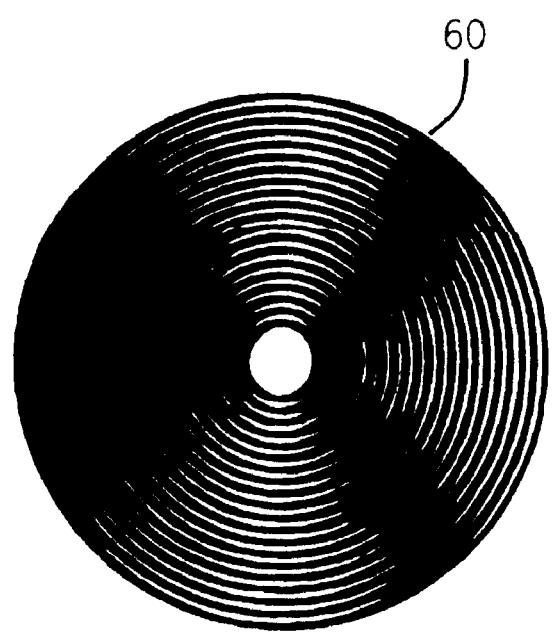

With reference to FIGS. 6A and 6B, photoresist layer 22 includes moiré pattern 60 as a result of the development of layer 22 after exposure to light at the first and second coherence levels ($\sigma_1$ and $\sigma_2$). The pattern 60 in FIG. 6A is representative of a moiré pattern that would result from a perfect lens, whereas the pattern 60 in FIG. 6B represent a moiré pattern that would result from an aberrated lens. Pattern 60 is formed after the provision of high and low coherence light through mask 18.

Figure 7:
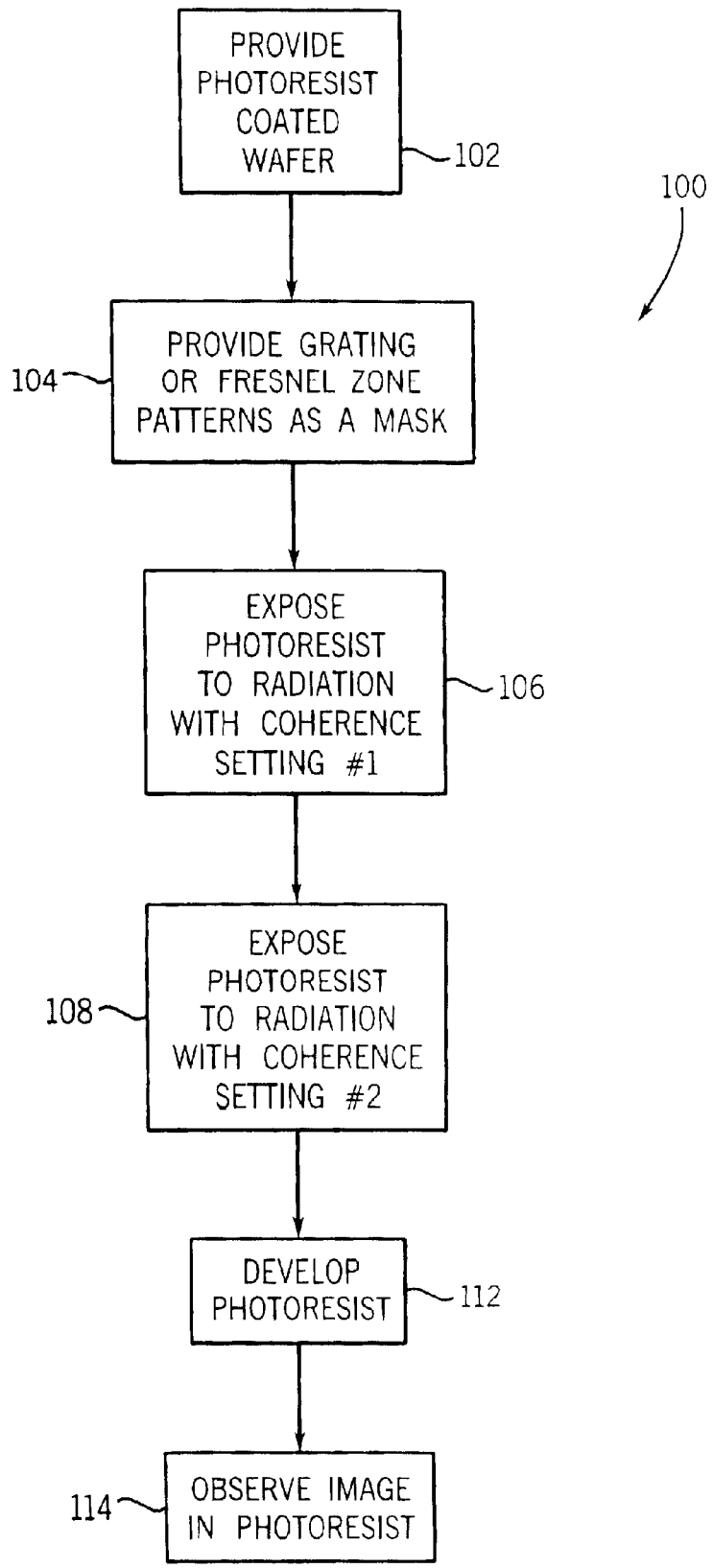
FIG. 7 is a flow diagram showing the process of the inspection for the photolithographic system illustrated in FIG. 1 in accordance with yet another exemplary embodiment.

With reference to FIG. 7, the process of testing lithographic system 10 is described with reference to flow diagram 100. Flow diagram 100 advantageously utilizes a double exposure at different coherence levels ($\sigma_1$ and $\sigma_2$) to accentuate local errors of pupil 32 (FIG. 2) in photoresist layer 22 (FIG. 1).

At a step 102, substrate 24, including a photoresist layer 22, is provided in system 10 to receive radiation provided through lens assemblies 14 and 20 (FIG. 1). A mask 18 is provided between lens assemblies 14 and 20 at a step 104.

At a step 106, photoresist layer 22 is exposed to radiation through mask 18. Condenser optics 14 (FIG. 1) can be set to provide high coherence level ($\sigma_1$) radiation. Preferably, the high coherence radiation has a pupil fill factor of $\sigma=0.25$ or less. After exposure to high coherence level radiation, layer 22 can be moved laterally with respect to source 12. System 10 can include a stage for moving substrate 24 slightly (e.g., 20 nm). The movement of layer 22 can help establish moiré patterns in the presence of errors on pupil 32.

At a step 108, photoresist layer 22 is exposed to radiation through mask 18 at a low coherence level ($\sigma_2$). Light source 12 can be set to provide low coherence level ($\sigma_2$) at a pupil fill factor of 0.85 or more.

At a step 112, substrate 24, including layer 22, can be removed from system 12, and photoresist layer 22 developed.

At a step 114, photoresist layer 22 can be viewed via a microscope or a camera. The viewing of patterns on developed layer 22 reveals whether defects or aberration errors are present on lens assembly 20. For example, moiré pattern 60 (FIG. 6) can reveal the presence of lens aberrations.

With reference to FIGS. 8 and 9, high and low coherence image received in photoresist layer 22 (steps 106 and 108, respectively, in FIG. 7) are represented on graphs 120 and 130. The X-axes of graphs 120 and 130 represent the position on layer 22, and the Y-axes of graphs 120 and 130 represent light received at the first and second coherence levels ($\sigma_1$ and $\sigma_2$).

Graph 120 includes a solid line 122 representative of the intensity of light at the first coherence level (all received through mask 18 (the high coherence image) (step 106). Graph 120 also includes a solid line 124 representative of the intensity of light received at the second coherence level ($\sigma_2$) (the low coherence image)(step 108). Graph 120 further includes a dashed line 126 representative of the combination of lines 122 and 124. Dashed line 126 represents the intensity of light received by layer 22 at the first and second coherence levels ($\sigma_1$ and $\sigma_2$) (a combined image of the low coherence image and the high coherence image).

The image represented by dashed line 126 indicates that errors are not present in pupil 32. The image corresponds to the circular chirped grating pattern associated with mask 18.

With reference to FIG. 8, graph 130 includes a solid line 132 representative of the intensity of light at the first coherence level ($\sigma_1$) received through mask 18 (the high coherence image) (step 106). Graph 130 also includes a solid 132 representative of the intensity of light received at the second coherence level ($\sigma_2$) (the low coherence image) (step 108). Graph 130 further includes a dashed line 136 representative of the combination of lines 132 and 134. Dashed line 136 represents the intensity of light received by layer 22 at the first and second coherence levels ($\sigma_1$ and $\sigma_2$) (a combined image of the low coherence image and the high coherence image).

Dashed line 136 indicates that local errors are present in pupil 32. Line 136 includes a beat frequency associated with the combination of lines 132 and 134. The beat frequency is manifested as a moiré effect.

It is understood that while preferred embodiment and specific examples are given, they are for the purpose of illustration only and is not limited to the precise details disclosed. For example, although specific wavelengths of light are described, other types of light can be utilized. Further, although two coherence levels are discussed, different coherence levels can be utilized. Various modifications may be made in the details within the scope and range of the equivalence of the claims without departing from what is claimed.

What is claimed is:

1. A method of inspecting a lens assembly utilized in a lithographic stepper, the method comprising:

providing radiation at a first coherence through a reticle or mask to a photoresist material;

providing radiation at a second coherence through the mask or reticle to the photoresist material;

developing the photoresist material; and observing the photoresist material for an error associated with the lens assembly.

2. The method of claim 1, further comprising, moving the mask or reticle between the providing radiation at a first coherent step and the providing radiation at a second coherent step.

3. The method of claim 1, wherein errors are indicated by the observation of a moiré effect.

4. The method of claim 1, wherein the first coherence is when the lens assembly has a pupil fill factor of approximately 0.25.

5. The method of claim 1, wherein the second coherence is when the lens assembly is at a pupil fill factor of more than 0.85.

6. The method of claim 1, wherein the reticle or mask has a circular chirped pattern.

7. A method of inspecting a pupil associated with manufacture of an integrated circuit, the method comprising:

providing a pattern of low coherence radiation via a reticle or mask to photoresist material;

providing a pattern of high coherence radiation to via a reticle or mask photoresist material;

developing the photoresist material; and observing the photoresist material to determine a presence of a lens aberration error.

8. The method of claim 7, wherein the observing step utilizes a camera or a microscope.

9. The method of claim 7, wherein the pattern of low coherence radiation and the pattern of high coherence radiation are provided via the mask or reticle with a grating.

10. The method of claim 9, wherein the mask or reticle includes a circular chirped grating.

11. The method of claim 10, wherein the mask or reticle includes a fresnel zone plate pattern.

12. The method of claim 10, wherein the low coherence radiation is provided at a pupil fill factor of 0.85.

13. The method of claim 10, wherein the high coherence radiation is provided at a pupil fill factor of less than 0.25.

14. The method of claim 7, wherein errors are indicated by observation of a moiré effect pattern.

15. An inspection system for an optical system for use in an integrated circuit fabrication system, the inspection system comprising:

means for providing radiation at first coherence via a reticle or mask to a photoresist material;

means for providing radiation at a second coherence via a reticle or mask to the photoresist material;

means for developing the photoresist material; and means for observing the photoresist material for an error associated with the optical system.

16. The inspection system of claim 15, further comprising:

means for patterning the radiation at the first coherence and the second coherence.

17. The inspection system of claim 16, wherein the means for patterning is a reticle having a circular chirped grating pattern.

18. The inspection system of claim 16, further comprises:

means for moving the means for patterning.

19. The inspection system of claim 17, wherein the means for observing can identify a moiré effect to identify errors.

20. The inspection system of claim 15, wherein the high coherence is at a pupil fill factor of approximately 0.25 and the low coherence is at a pupil fill factor of approximately 0.85.

* * * * *